(12) United States Patent
Kumar et al.

(10) Patent No.: US 6,551,865 B2
(45) Date of Patent: Apr. 22, 2003

(54) SILICON CARBIDE SEMICONDUCTOR DEVICE AND METHOD OF FABRICATING THE SAME

(75) Inventors: Rajesh Kumar, Kariya (JP); Hiroki Nakamura, Kariya (JP); Jun Kojima, Oobu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/107,174

(22) Filed: Mar. 28, 2002

(65) Prior Publication Data
US 2002/0139992 A1 Oct. 3, 2002

(30) Foreign Application Priority Data
Mar. 30, 2001 (JP) ........................... 2001-101605

(51) Int. Cl.[7] ............... H01L 21/332; H01L 21/338; H01L 21/337; H01L 31/0312; H01L 29/74
(52) U.S. Cl. ............... 438/137; 438/138; 438/173; 438/193; 438/194; 438/195; 438/931; 257/77; 257/134; 257/135; 257/260; 257/263
(58) Field of Search ............... 438/137, 136, 438/138, 173, 192, 193, 194, 195, 931, 270, 271, 317, 186, 189, 280, 800; 257/77, 134, 135, 260, 263, 270, 278, 256, 264

(56) References Cited

U.S. PATENT DOCUMENTS

| | | | |
|---|---|---|---|
| 5,917,203 A | * | 6/1999 | Bhatnagar et al. .......... 257/139 |
| 6,057,558 A | | 5/2000 | Yamamoto et al. ............ 257/77 |
| 6,380,565 B1 | * | 8/2000 | Duclos et al. ............... 257/107 |
| 6,117,735 A | | 9/2000 | Ueno .......................... 438/268 |

FOREIGN PATENT DOCUMENTS

| | | |
|---|---|---|
| JP | 8-288500 | 11/1996 |
| JP | 10-308512 | 11/1998 |
| JP | 11-195655 | 7/1999 |
| JP | 11-274173 | 10/1999 |

OTHER PUBLICATIONS

"Dynamic characteristics of high voltage 4H–SiC vertical JFETs." by Heinz Mitlehner et al.; 1999 IEEE p. 339–342.

* cited by examiner

Primary Examiner—Olik Chaudhuri
Assistant Examiner—Neal Berezny
(74) Attorney, Agent, or Firm—Posz & Bethards, PLC (57) ABSTRACT

Openings are formed in a laminate of a polycrystalline silicon film and an LTO film on a channel layer. While the laminate is used as a mask, impurities are implanted into a place in the channel layer which is assigned to a source region. Also, impurities are implanted into another place in the channel layer which is assigned to a portion of a second gate region. A portion of the polycrystalline silicon film which extends from the related opening is thermally oxidated. The LTO film and the oxidated portion of the polycrystalline silicon film are removed. While a remaining portion of the polycrystalline silicon film is used as a mask, impurities are implanted into a place in the channel layer which is assigned to the second gate region. Accordingly, the source region and the second gate region are formed on a self-alignment basis which suppresses a variation in channel length.

12 Claims, 8 Drawing Sheets

SILICON CARBIDE SEMICONDUCTOR DEVICE AND METHOD OF FABRICATING THE SAME

BACKGROUND OF THE INVENTION

1. Field of the Invention

This invention relates to a silicon carbide semiconductor device such as a junction field-effect transistor (JFET). In addition, this invention relates to a method of fabricating a silicon carbide semiconductor device such as a JFET.

2. Description of the Related Art

U.S. Pat. No. 6,117,735 corresponding to Japanese patent application publication number 11-195655 discloses a method of forming a silicon carbide vertical FET in which ion implantation is implemented while a first mask and a second mask overlapping the first mask are used. As a result of the ion implantation, a first conductivity type impurity region is defined by one end of a certain portion of the first mask. The portion of the first mask and the second mask are then removed so that a second conductivity type impurity region is defined by another portion of the first mask. Thus, the first conductivity type impurity region and the second conductivity type impurity region are formed on a self-alignment basis. In the case where a mask including a tapered end portion is used and ion implantation is conducted with different accelerating-field voltages, the first conductivity type region and the second conductivity type region can be formed on a self-alignment basis using only one mask. The threshold voltage can be adjusted by controlling the impurity concentration of the channel region. The silicon carbide vertical FET is of a normally-off type.

U.S. Pat. No. 6,057,558 corresponding to Japanese patent application publication number 10-308512 discloses a trench gate type power MOSFET including a thin film of silicon carbide which defines a side of a trench. Specifically, the power MOSFET includes an n-type thin semiconductor film defining a side of the trench, and a gate oxide film occupying a bottom of the trench. The power MOSFET further includes an $n^-$-type epitaxial layer and a p-type epitaxial layer between which an $n^+$-type epitaxial layer extends. The p-type epitaxial layer, the $n^+$-type epitaxial layer, and the $n^-$-type epitaxial layer compose a $pn^+n^-$ diode. The impurity concentration and the thickness of the $n^+$-type epitaxial layer are chosen so that the withstand voltage of the $pn^+n^-$ diode will be lower than the withstand voltage of a surface of the gate oxide film in the trench bottom. As a result, the $pn^+n^-$ diode undergoes avalanche breakdown before the trench bottom does. Therefore, it is possible to prevent destruction of the gate oxide film.

Heinz Mitlehner et al have reported "Dynamic characteristics of high voltage 4H-SiC vertical JFETs", 1999 IEEE, pages 339–342. Specifically, Heinz Mitlehner et al fabricated fully implanted SiC VJFETs on n-type epilayers grown on the Si(0001)-face of n-type 4H-SiC substrates. The epilayers were grown in two steps. The first epilayer was formed. After registration masks were defined, the first epilayer was exposed to ion implantation so that the buried p-layer was implanted with aluminum. Then, the second epilayer creating the channel and pinch off region was grown onto the first epilayer. The p-gate region was implanted over the whole cell area. In three etching steps, the gate overlay, the source area and the short connection of the source region to the buried p-layer were defined. To avoid breakdown due to field crowding at the edges, a JTE-edge termination was used. After the wafers were annealed, a field oxide was deposited. Ni-contacts on back and front were defined via lithography and lift-off. After a short contact anneal, the insulation oxide was deposited and patterned via dry etching. Finally, the metallization was thermally evaporated and patterned by wet etching.

Japanese patent application publication No. 11-274173 discloses a method of fabricating a silicon carbide semiconductor device in which a mask member is formed on an $n^-$-type silicon carbide epitaxial layer. Prescribed areas of the mask member are provided with openings which have inclined side surfaces. Ion implantations into the $n^-$-type silicon carbide epitaxial layer via the openings are performed so that $p^-$-type silicon carbide base regions and $n^+$-type source regions are formed therein. The $n^+$-type source regions are smaller in junction depth than the $p^-$-type silicon carbide base regions. Since only one mask is used in this way, the formation of the $p^-$-type silicon carbide base regions and the $n^+$-type source regions is based on self-alignment. Therefore, the positions of the $p^-$-type silicon carbide base regions and the $n^+$-type source regions are accurate.

Japanese patent application publication number 8-288500 discloses a silicon carbide semiconductor device including a planar-type pn junction. An edge of the planar-type pn junction is of a thin flat shape to suppress concentration of electric field. The pn junction is formed by ion implantation using a mask which is made as follows. After a process of providing close adhesion between a photoresist film and a mask film is implemented, the combination of the films is exposed to isotropic etching to form the mask.

SUMMARY OF THE INVENTION

It is a first object of this invention to provide a silicon carbide semiconductor device which is excellent in on-resistance (on-state resistance), withstand voltage, and avalanche breakdown.

It is a second object of this invention to provide a method of fabricating a silicon carbide semiconductor device which is excellent in on-resistance, withstand voltage, and avalanche breakdown.

A first aspect of this invention provides a method of fabricating a silicon carbide semiconductor device. The method comprises the steps of forming a semiconductor layer (2) on a main surface of a semiconductor substrate (1), the semiconductor layer (2) and the semiconductor substrate (1) being of a first conductivity type, the semiconductor layer (2) being made of silicon carbide, the semiconductor substrate (1) being made of silicon carbide, the semiconductor layer (2) being higher in resistivity than the semiconductor substrate (1); forming a first gate region (3) in a surface portion of the semiconductor layer (2), the first gate region (3) being of a second conductivity type different from the first conductivity type; forming a channel layer (5) of the first conductivity type on the semiconductor layer (2) and the first gate region (3); forming a source region (6) of the first conductivity type in the channel layer (5), the source region (6) being opposed to the first gate region (3); forming a second gate region (7) in a surface portion of the channel layer (5), the second gate region (7) being of the second conductivity type and containing a positional range opposed to the source region (6); forming a recess (8) in the channel layer (5), the recess (8) extending through the second gate region (7) and the source region (6) and reaching the first gate region (3); forming a first gate electrode (9, 33, 42), a source electrode (9, 32, 41), and a second gate electrode (10, 32, 43), the first gate electrode (9, 33, 42) being electrically connected with the first gate region (3), the source electrode (9, 32, 41) being electrically connected with the source region (6), the second gate electrode (10, 32, 43) being electrically connected with the second gate region (7); and forming a drain electrode (12) on a back surface of the semiconductor substrate (1). The step of forming the source region (6) and the step of forming the second gate region (7) comprise the sub-steps of (a) placing first and second mask films (21, 22) on the channel layer (5), the first mask film (21) being covered with the second mask film (22); (b) forming first and second openings (21A, 22A) in the first and second mask films (21, 22) respectively; (c) implanting first ions into a first predetermined place in the channel layer (5) which is assigned to the source region (6) while using the first and second mask films (21, 22) as a mask, the first ions being first impurities corresponding to the first conductivity type; (d) implanting second ions into a second predetermined place in the channel layer (5) which is different from the first predetermined place and is assigned to a portion of the second gate region (7) while using the first and second mask films (21, 22) as a mask, the second ions being second impurities corresponding to the second conductivity type; (e) oxidating a portion of the first mask film (21) which extends from the first opening (21A) while the first mask film (21) remains covered with the second mask film (22); (f) removing the second mask film (22) and the oxidated portion of the first mask film (21); (g) implanting third ions into a third predetermined place in the channel layer (5) which is different from the first predetermined place and is assigned to the second gate region (7) while using a remaining portion (21B) of the first mask film (21) as a mask, the third ions being third impurities corresponding to the second conductivity type; and (h) activating the implanted first, second, and third impurities to form the source region (6) and the second gate region (7).

A second aspect of this invention is based on the first aspect thereof, and provides a method wherein the first mask film (21) uses a polycrystalline silicon film.

A third aspect of this invention is based on the first aspect thereof, and provides a method wherein the second mask film (22) uses one of an oxide film and a nitride film.

A fourth aspect of this invention provides a method of fabricating a silicon carbide semiconductor device. The method comprises the steps of forming a semiconductor layer (2) on a main surface of a semiconductor substrate (1), the semiconductor layer (2) and the semiconductor substrate (1) being of a first conductivity type, the semiconductor layer (2) being made of silicon carbide, the semiconductor substrate (1) being made of silicon carbide, the semiconductor layer (2) being higher in resistivity than the semiconductor substrate (1); forming a first gate region (3) in a surface portion of the semiconductor layer (2), the first gate region (3) being of a second conductivity type different from the first conductivity type; forming a channel layer (5) of the first conductivity type on the semiconductor layer (2) and the first gate region (3); forming a source region (6) of the first conductivity type in the channel layer (5), the source region (6) being opposed to the first gate region (3); forming a second gate region (7) in a surface portion of the channel layer (5), the second gate region (7) being of the second conductivity type and containing a positional range opposed to the source region (6); forming a recess (8) in the channel layer (5), the recess (8) extending through the second gate region (7) and the source region (6) and reaching the first gate region (3); forming a first gate electrode (9, 33, 42), a source electrode (9, 32, 41), and a second gate electrode (10, 32, 43), the first gate electrode (9, 33, 42) being electrically connected with the first gate region (3), the source electrode (9, 32, 41) being electrically connected with the source region (6), the second gate electrode (10, 32, 43) being electrically connected with the second gate region (7); and forming a drain electrode (12) on a back surface of the semiconductor substrate (1). The step of forming the source region (6) and the step of forming the second gate region (7) comprise the sub-steps of (a) placing a mask film (21) on the channel layer (5); (b) forming an openings (21A) in the first mask film (21); (c) after the step (b), implanting first ions into a first predetermined place in the channel layer (5) which is assigned to the source region (6) while using the mask film (21) as a mask, the first ions being first impurities corresponding to the first conductivity type; (d) after the step (b), implanting second ions into a second predetermined place in the channel layer (5) which is different from the first predetermined place and is assigned to a portion of the second gate region (7) while using the mask film (21) as a mask, the second ions being second impurities corresponding to the second conductivity type; (e) subjecting the mask film (21) to isotropic etching to expand the opening; (f) after the step (e), implanting third ions into a third predetermined place in the channel layer (5) which is different from the first predetermined place and is assigned to the second gate region (7) while using a remaining portion (21F) of the mask film (21) as a mask, the third ions being third impurities corresponding to the second conductivity type; and (g) activating the implanted first, second, and third impurities to form the source region (6) and the second gate region (7).

A fifth aspect of this invention is based on the fourth aspect thereof, and provides a method wherein the mask film (21) uses a polycrystalline silicon film.

A sixth aspect of this invention is based on the first aspect thereof, and provides a method further comprising the step of forming a body break region (4) located below the first gate region (3) and being of the first conductivity type.

A seventh aspect of this invention is based on the sixth aspect thereof, and provides a method wherein the step of forming the first gate region (3) and the step of forming the body break region (4) comprise ion implantations using a same mask.

An eighth aspect of this invention is based on the first aspect thereof, and provides a method wherein the step of forming the first gate region (3) comprises the sub-steps of implanting boron ions into the surface portion of the semiconductor layer (2), the boron ions being impurities corresponding to the second conductivity type, activating the impurities in the surface portion of the semiconductor layer (2) to form the first gate region (3), and diffusing the impurities out of the first gate region (3) to form a second-conductivity-type region (3a) deeper than the first gate region (3).

A ninth aspect of this invention is based on the first aspect thereof, and provides a method wherein one among the step of forming the first gate region (3), the step of forming the source region (6), and the step of forming the second gate region (7) comprises the sub-step of using a mixture of fourth impurities corresponding to the first conductivity type and fifth impurities corresponding to the second conductivity type.

A tenth aspect of this invention is based on the ninth aspect thereof, and provides a method wherein in cases where one among the step of forming the first gate region (3) and the step of forming the second gate region (7) comprises the sub-step of using a mixture of fourth impurities corresponding to the first conductivity type and fifth impurities corresponding to the second conductivity type, a density of the fifth impurities is higher than that of the fourth impurities; and in cases where the step of forming the source region (6) comprises the sub-step of using a mixture of fourth impurities corresponding to the first conductivity type and fifth impurities corresponding to the second conductivity type, a density of the fourth impurities is higher than that of the fifth impurities.

An eleventh aspect of this invention is based on the first aspect thereof, and provides a method wherein the step of forming the first gate region (3), the step of forming the channel layer (5), and the step of forming the second gate region (7) comprise the sub-steps of setting impurity concentrations of the first gate region (3), the channel layer (5), and the second gate region (7) so that a depletion layer extending from the first gate region (3) and a depletion layer extending from the second gate region (7) cause the channel layer (5) to be in a pinch-off state in the absence of application of a voltage to the first gate region (3) and the second gate region (7).

A twelfth aspect of this invention is based on the eleventh aspect thereof, and provides a method wherein the step of forming the channel layer (5) comprises the sub-step of setting the impurity concentration of the channel layer lower than that of the semiconductor layer (2).

A thirteenth aspect of this invention provides a silicon carbide semiconductor device comprising a semiconductor substrate (1) having a main surface and a back surface opposite to each other, the semiconductor substrate (1) being made of silicon carbide and being of a first conductivity type; a semiconductor layer (2) extending on the main surface of the semiconductor substrate (1), the semiconductor layer (2) being made of silicon carbide and being of the first conductivity type, the semiconductor layer (2) being higher in resistivity than the semiconductor substrate (1); a first gate region (3) extending in a surface portion of the semiconductor layer (2), the first gate region (3) being of a second conductivity type different from the first conductivity type; a channel layer (5) extending on the semiconductor layer (2) and the first gate region (3) and being of the first conductivity type; a source region (6) extending in the channel layer (5), the source region (6) being of the first conductivity type and being opposed to the first gate region (3); a second gate region (7) extending in a surface portion of the channel layer (5), the second gate region (7) being of the second conductivity type and containing a positional range opposed to the source region (6); a recess (8) extending in the channel layer (5), the recess (8) extending through the second gate region (7) and the source region (6) and reaching the first gate region (3); a first gate electrode (9, 33, 42) electrically connected with the first gate region (3); a source electrode (9, 32, 41) electrically connected with the source region (6); a second gate electrode (10, 32, 43) electrically connected with the second gate region (7); a drain electrode (12) extending on the back surface of the semiconductor substrate (1); and a body break region (4) located below the first gate region (3) and being of the first conductivity type, the body break region (4) having an impurity concentration higher than that of the semiconductor layer (2).

A fourteenth aspect of this invention is based on the thirteenth aspect thereof, and provides a silicon carbide semiconductor device further comprising a second-conductivity-type region (3a) adjoining an edge of the first gate region (3) and being deeper than the first gate region (3), the second-conductivity-type region (3a) having an impurity concentration lower than that of the first gate region (3).

DETAILED DESCRIPTION OF THE INVENTION

A prior-art silicon carbide semiconductor device will be explained below for a better understanding of this invention.

Figure 1:
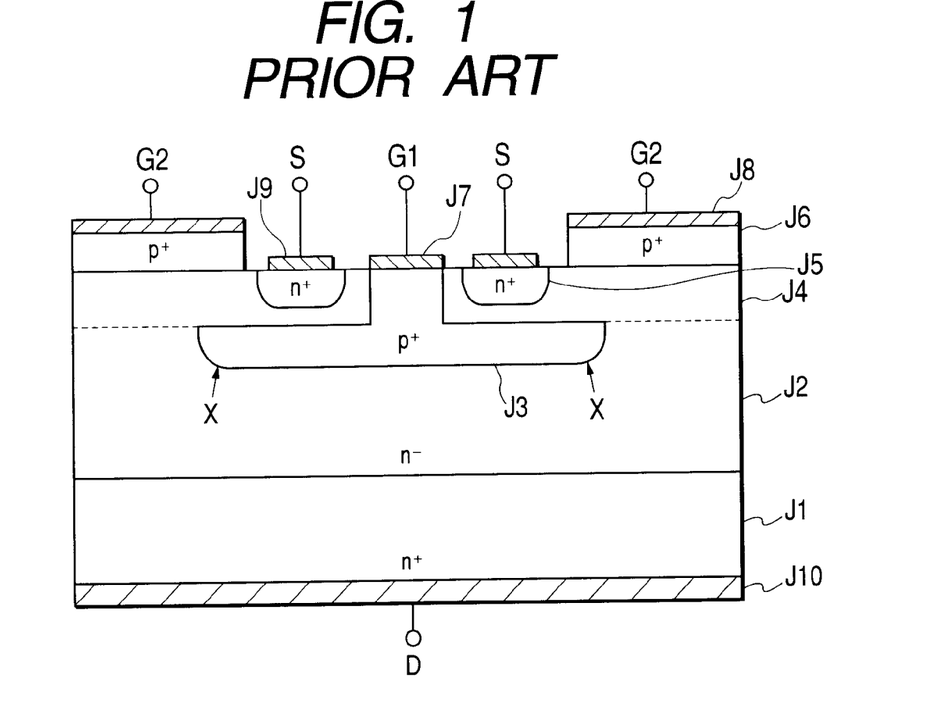
FIG. 1 is a sectional diagram of a prior-art n-channel JFET (junction field-effect transistor).

FIG. 1 shows a prior-art n-channel JFET which includes an $n^+$-type substrate J1 made of SiC (silicon carbide). An $n^-$-type epitaxial layer J2 is grown on a main surface of the $n^+$-type substrate J1. A surface portion of the $n^-$-type epitaxial layer J2 is formed with a $p^+$-type region constituting a first gate region J3.

A channel layer J4 extends on a portion of the $n^-$-type epitaxial layer J2 which is uncovered from the first gate region J3. The channel layer J4 also extends on a portion of the first gate region J3 except a central area thereof. An $n^+$-type source region J5 is formed in the channel layer J4. The $n^+$-type source region J5 extends above a main portion of the first gate region J3. A p-type region constituting a second gate region J6 extends on the channel layer J4. As viewed from the top, the second gate region J6 partially overlaps a portion of the first gate region J3 which extends outward from the $n^+$-type source region J5. A first gate electrode J7 extends on and contacts with the central area of the first gate region J3. A second gate electrode J8 extends on and contacts with the second gate region J6. A source electrode J9 extends on and contacts with the $n^+$-type source region J5. A drain electrode J10 extends on and contacts with a back surface of the $n^+$-type substrate J1.

In operation of the prior-art JFET of FIG. 1, a channel is formed by controlling the widths of depletion layers extending from the first and second gate regions J3 and J6 toward the channel layer J4, and a current is made to flow between the source and the drain through the channel.

In the prior-art JFET of FIG. 1, the first and second gate regions J3 and J6, and the $n^+$-type source region J5 are formed by epitaxy or ion implantations using masks. The formation of the first and second gate regions J3 and J6, and the $n^+$-type source region J5 does not use self-alignment. Positional errors of the masks cause problems as follows. The channel length is uneven. There are separate portions having a high on-resistance and a low on-resistance respectively, and separate portions having a high withstand voltage and a low withstand voltage respectively. Accordingly, the prior-art JFET of FIG. 1 tends to be high in on-resistance and low in withstand voltage.

In the prior-art JFET of FIG. 1, since silicon carbide has a small diffusion coefficient, the roundness of the lower edge of the first gate region J3 is insufficient. Therefore, it is difficult to provide the prior-art JFET with such a body break structure as that in a silicon semiconductor device. As a result, a breakdown tends to occur at each of points X in the lower edge of the first gate region J3. Since the first gate electrode J7 is considerably distant from the breakdown occurrence positions, the internal resistance of a portion therebetween is great. Thus, a parasitic npn bipolar transistor composed of the n+-type source region J5, the first gate region J3, and the n−-type epitaxial layer J2 (or the n−-type epitaxial layer J2 plus the n+-type substrate J1) effectively operates so that the prior-art JFET breaks. Accordingly, the prior-art JFET is insufficient in ability to withstand avalanche breakdown.

First Embodiment

Figure 2:
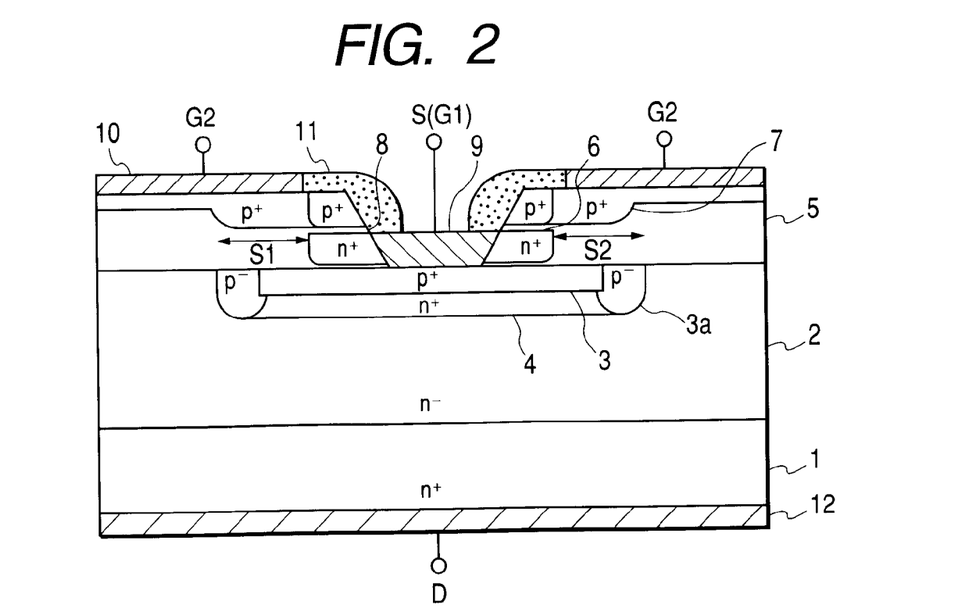
FIG. 2 is a sectional diagram of an n-channel JFET according to a first embodiment of this invention.

FIG. 2 shows a silicon carbide semiconductor device according to a first embodiment of this invention. The semiconductor device of FIG. 2 is an n-channel JFET (junction field-effect transistor) of a single gate drive type. A JFET corresponding to one cell is illustrated in FIG. 2.

The JFET of FIG. 2 includes an n+-type substrate 1 made of SiC (silicon carbide). The n+-type substrate 1 has opposite surfaces, that is, an upper surface and a lower surface being a main surface and a back surface respectively. An n−-type epitaxial layer 2 made of SiC is formed on the main surface of the n+-type substrate 1 by epitaxy. The n−-type epitaxial layer 2 is lower in dopant concentration (impurity concentration) than the n+-type substrate 1. Thus, the n−-type epitaxial layer 2 is higher in resistivity than the n+-type substrate 1.

A p+-type layer constituting a first gate region 3 is formed in a prescribed area of a surface portion of the n−-type epitaxial layer 2. A p−-type region (second conductivity type region) 3a is formed in the n−-type epitaxial layer 2. The p−-type region 3a extends along the outer edge of the first gate region 3. Thus, the p−-type region 3a adjoins the outer edge of the first gate region 3. The formation of the p−-type region 3a is implemented by thermally diffusing impurities from the first gate region 3 into the n−-type epitaxial layer 2. The p−-type region 3a has an impurity concentration lower than that of the first gate region 3. The p−-type region 3a is deeper than the first gate region 3. In more detail, the p−-type region 3a is greater in junction depth than the first gate region 3. An n+-type body break region 4 is formed in the n−-type epitaxial layer 2. The n+-type body break region 4 extends below the first gate region 3. The n+-type body break region 4 adjoins the first gate region 3. The n+-type body break region 4 has a pattern similar to that of the first gate region 3. The n+-type body break region 4 and the first gate region 3 align with each other as viewed from the device top. The n+-type body break region 4 has an impurity concentration higher than that of the n−-type epitaxial layer 2. The impurity concentration of the n+-type body break region 4 is equal to a value in the range of, for example, $1 \times 10^{17}$ cm$^{-3}$ to $1 \times 10^{18}$ cm$^{-3}$. As will be explained later, the n+-type body break region 4 enhances the ability to withstand avalanche breakdown.

An n−-type layer constituting a channel layer 5 is formed on upper surfaces of the n−-type epitaxial layer 2, the first gate region 3, and the p−-type region 3a by epitaxy. An impurity concentration of the channel layer 5 is set lower than that of the n−-type epitaxial layer 2. An intermediate portion of the channel layer 5 which extends above the first gate region 3 is formed with an n+-type source region 6. The n+-type source region 6 aligns with the first gate region 3 as viewed from the device top. A surface portion of the channel layer 5 is formed with a p+-type layer constituting a second gate region 7. The second gate region 7 has a relatively high impurity concentration which varies from position to position. Specifically, a portion of the second gate region 7 which is opposed to the n+-type source region 6 has a maximum impurity concentration. This portion is referred to as the greatly-doped portion. The second gate region 7 has an inner portion and an outer portion extending outward of the inner portion. The outer portion is shallower than the inner portion. In other words, the outer portion is smaller in junction depth than the inner portion. The inner edge of the shallow portion (the outer portion) is a prescribed distance away outward from the outer edge of the greatly-doped portion. Thus, the inner edge of the shallow portion is the prescribed distance away outward from the outer edge of the n+-type source region 6. In FIG. 2, the left-hand horizontal distance S1 between the outer edge of the n+-type source region 6 and the outer edge of the deep portion (the inner portion) of the second gate region 7 is equal to the right-hand horizontal distance S2 between the outer edge of the n+-type source region 6 and the outer edge of the deep portion of the second gate region 7.

A recess 8 is formed in the channel layer 5. The recess 8 extends through the second gate region 7 and the n+-type source region 6, and reaches the first gate region 3. A source electrode 9 is located in a lower part of the recess 8. The source electrode 9 is electrically connected with the n+-type source region 6. Also, the source electrode 9 is electrically connected with the first gate region 3. Accordingly, the source electrode 9 can act as a first gate electrode for controlling the voltage at the first gate region 3.

A second gate electrode 10 is formed on an upper surface of the second gate region 7. The voltage at the second gate region 7 can be controlled via the second gate electrode 10. A passivation film 11 located in the recess 8 and extending above the source electrode 9 insulates and separates the source electrode 9 and the second gate electrode 10 from each other.

A drain electrode 12 is formed on the back surface of the n+-type substrate 1. The drain electrode 12 is electrically connected with the n+-type substrate 1.

The JFET of FIG. 2 is designed to operate as a normally-off device. The impurity concentrations of the first gate region 3, the second gate region 7, and the channel layer 5 are chosen to implement the following steps of JFET operation. In the absence of application of a voltage to the second gate electrode 10, a depletion layer extending from the first gate region 3 and a depletion layer extending from the second gate region 7 cause the channel layer 5 to be in a pinch-off state. When a desired voltage is applied to the second gate electrode 10, the length of the depletion layer from the second gate region 7 is decreased so that a channel occurs. Thus, in this case, a current flows in an order as "the source electrode 9→the n+-type source region 6→the channel layer 5→the n−-type epitaxial layer 2→the n+-type substrate 1→the drain electrode 12".

In the JFET of FIG. 2, the length of the channel is substantially equal to the horizontal distance between the outer edge of the n+-type source region 6 and the outer edge of the deep portion (the inner portion) of the second gate region 7. The on-resistance (on-state resistance) and the withstand voltage of the JFET in FIG. 2 are determined by the channel length, that is, the distance between the horizontal distance between the outer edge of the n+-type source region 6 and the outer edge of the deep portion of the second gate region 7. As previously mentioned, in FIG. 2, the left-hand horizontal distance S1 between the outer edge of the n$^+$-type source region 6 and the outer edge of the deep portion of the second gate region 7 is equal to the right-hand horizontal distance S2 between the outer edge of the n$^+$-type source region 6 and the outer edge of the deep portion of the second gate region 7. Thus, the channel length in a left-hand device portion and the channel length in a right-hand device portion are equal to each other. Accordingly, it is possible to prevent a drop in the withstand voltage of the JFET and an increase in the on-resistance of the JFET which would be caused by a variation in the channel length.

In the JFET of FIG. 2, the n$^+$-type body break region 4 extends immediately and directly below the first gate region 3. Therefore, it is possible to concentrate electric field on the n$^+$-type body break region 4. Accordingly, a lower withstand voltage can be provided, and a breakdown can be made to occur at a place immediately and directly below the first gate electrode (the source electrode 9) for controlling the voltage at the first gate region 3. This design makes it more difficult that a parasitic npn bipolar transistor composed of the n$^+$-type source region 6, the first gate region 3, and the n$^-$-type epitaxial layer J2 effectively operates. Thus, the ability to withstand avalanche breakdown can be enhanced.

Figure 3:
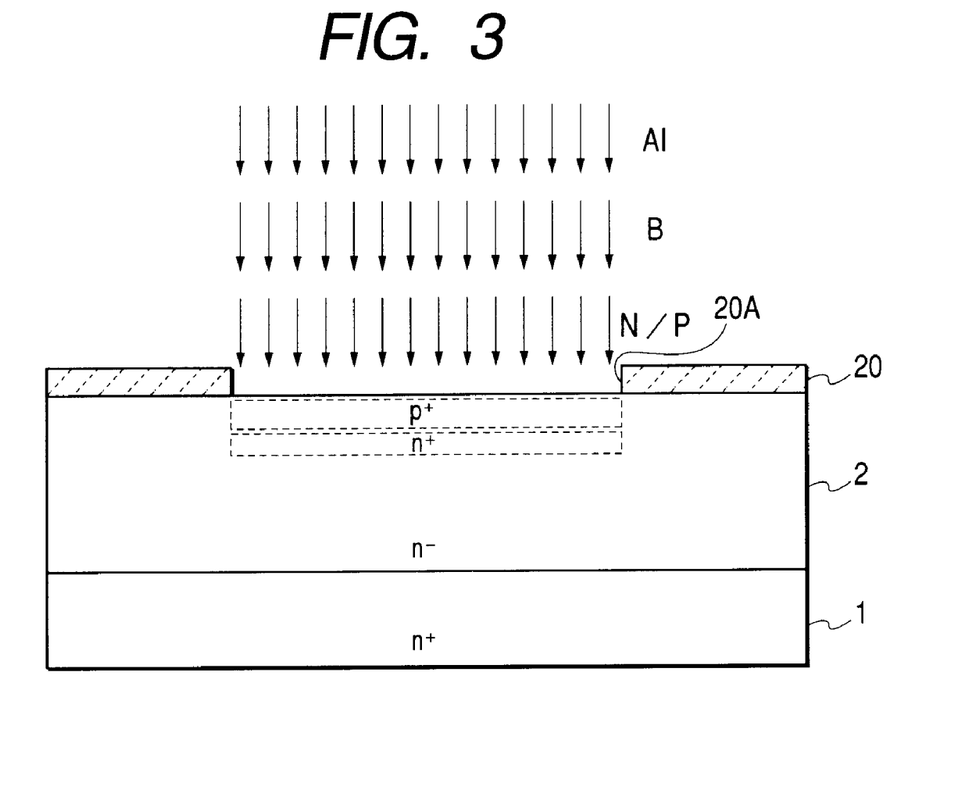
FIGS. 3, 4, 5, 6, 7, 8, 9, 10, 11, and 12 are sectional diagrams of different conditions of a 1-cell-corresponding portion of a semiconductor wafer (semiconductor body) which successively occur during the fabrication of the JFET in FIG. 2.

The JFET of FIG. 2 is fabricated as follows. With reference to FIG. 3, an n$^+$-type substrate 1 is prepared. The n$^+$-type substrate 1 uses an n-type 4H-SiC substrate, an n-type 6H-SiC substrate, an n-type 3C-SiC substrate, or an n-type 15R-SiC substrate. The n$^+$-type substrate 1 has a thickness of 400 μm. The n$^+$-type substrate 1 has a main surface corresponding to a (0001) Si surface or a (112-0) a surface. An n--type epitaxial layer 2 having a thickness of 5 μm is formed on the main surface of the n$^+$-type substrate 1 by epitaxy. The n$^-$-type epitaxial layer 2 is made of a crystal similar to that forming the n$^+$-type substrate 1. Thus, the n$^-$-type epitaxial layer 2 is an n-type 4H-SiC layer, an n-type 6H-SiC layer, an n-type 3C-SiC layer, or an n-type 15R-SiC layer.

An LTO (low temperature oxide) film 20 is superposed on a prescribed area of an upper surface of the n$^-$-type epitaxial layer 2. The LTO film 20 is patterned by photolithography so that a prescribed portion of the LTO film 20 has an opening 20A extending through the wall thereof. Ion implantations into the n$^-$-type epitaxial layer 2 are implemented while the LTO film 20 is used as a mask. Specifically, nitrogen ions or phosphorus ions being impurities corresponding to the n-type conductivity are implanted via the opening 20A into a predetermined place in the n$^-$-type epitaxial layer 2 which is assigned to an n$^+$-type body break region 4. Subsequently, boron ions being impurities corresponding to the p-type conductivity are implanted via the opening 20A into a predetermined place in the n$^-$-type epitaxial layer 2 which is assigned to a first gate region 3. At this time, aluminum ions may be implanted via the opening 20A into a predetermined surface portion of the n$^-$-type epitaxial layer 2 which is assigned to the first gate region 3 for providing contact with the first gate region 3.

Figure 4:
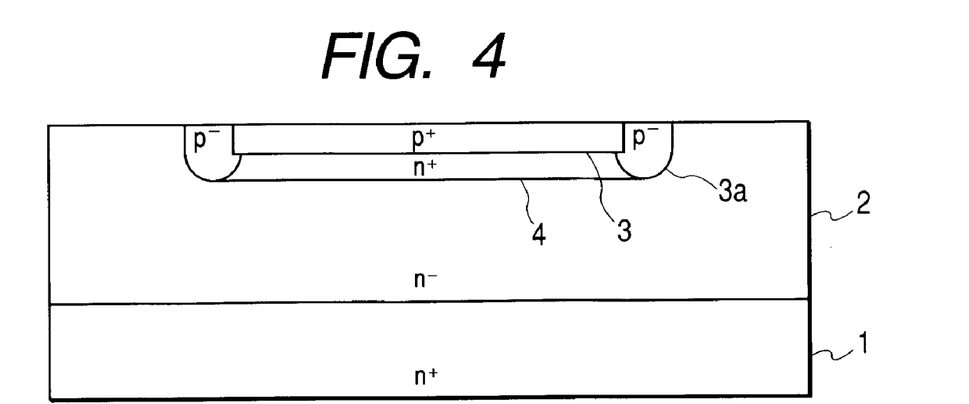

With reference to FIG. 4, after the ion implantations, implanted ions are activated. For example, the ion-implanted n$^-$-type epitaxial layer 2 is subjected to ramp anneal based on RTA (rapid thermal annealing). As a result of the ramp anneal, the first gate region 3 and the n$^+$-type body break region 4 are formed. Boron atoms are diffused out of the first gate region 3 by the ramp anneal so that a p$^-$-type region 3a is formed. Thereafter, the LTO film 20 is removed from the n$^-$-type epitaxial layer 2.

Figure 5:
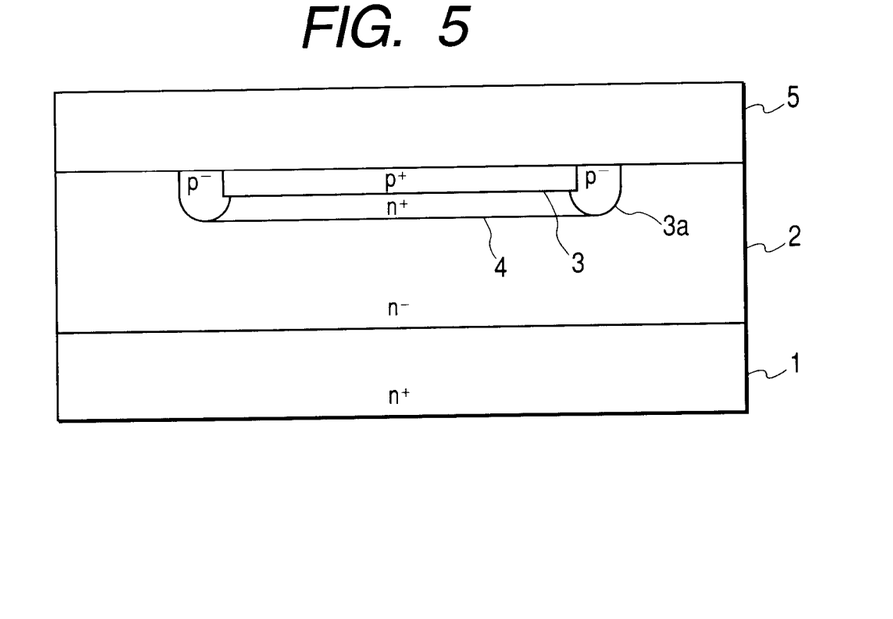

With reference to FIG. 5, after the removal of the LTO film 20, an n$^-$-type layer constituting a channel layer 5 is formed on upper surfaces of the n$^-$-type epitaxial layer 2, the first gate region 3, and the p$^-$-type region 3a by epitaxy. Preferably, the impurity concentration of the channel layer 5 is lower than that of the n$^-$-type epitaxial layer 2 to easily provide a JFET of a normally-off type.

Figure 6:
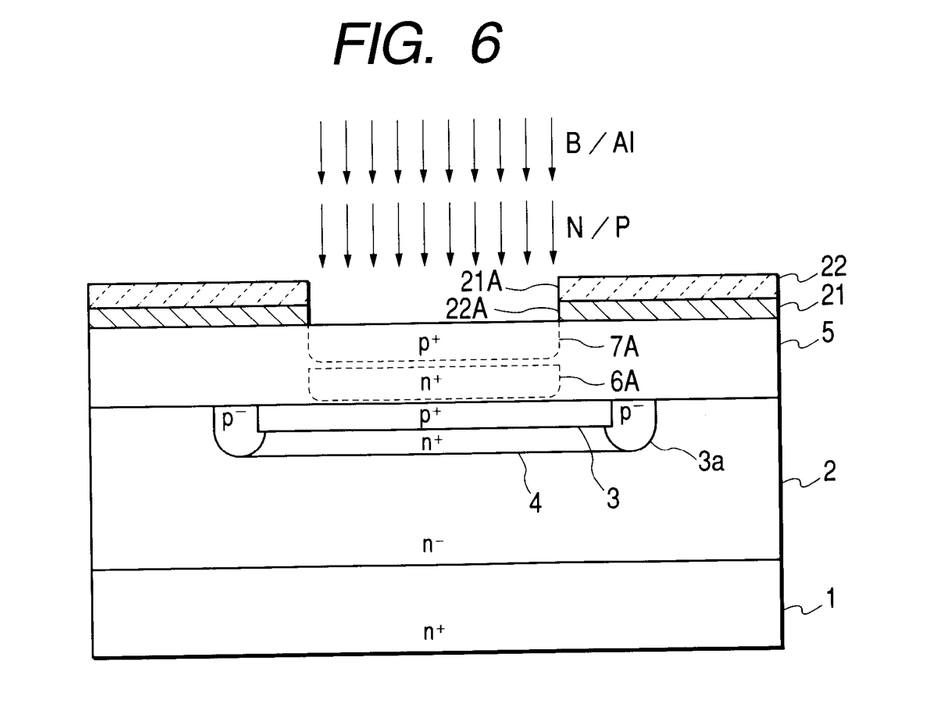

With reference to FIG. 6, a polycrystalline silicon film 21 is superposed on an upper surface of the channel layer 5. An LTO film 22 is superposed on an upper surface of the polycrystalline silicon film 21. Thus, a laminate of the polycrystalline silicon film 21 and the LTO film 22 is formed on the upper surface of the channel layer 5. The LTO film 22 may be replaced by a nitride film. The polycrystalline silicon film 21 and the LTO film 22 are patterned by photolithography so that prescribed portions of the polycrystalline silicon film 21 and the LTO film 22 have openings 21A and 22A extending through the walls thereof. The openings 21A and 22A are located in places opposed to an inner area of the first gate region 3. The openings 21A and 22A are of a same shape. The openings 21A and 22A align with the first gate region 3 as viewed from the top.

Ion implantations into the channel layer 5 are implemented while the laminate of the polycrystalline silicon film 21 and the LTO film 22 is used as a mask. Specifically, nitrogen ions or phosphorus ions being impurities corresponding to the n-type conductivity are implanted via the openings 21A and 22A into a predetermined place 6A in the channel layer 5 which is assigned to an n$^+$-type source region 6. Subsequently, boron ions or aluminum ions being impurities corresponding to the p-type conductivity are implanted via the openings 21A and 22A into a predetermined place 7A in the channel layer 5 which is assigned to a greatly-doped portion of a second gate region 7.

Figure 7:
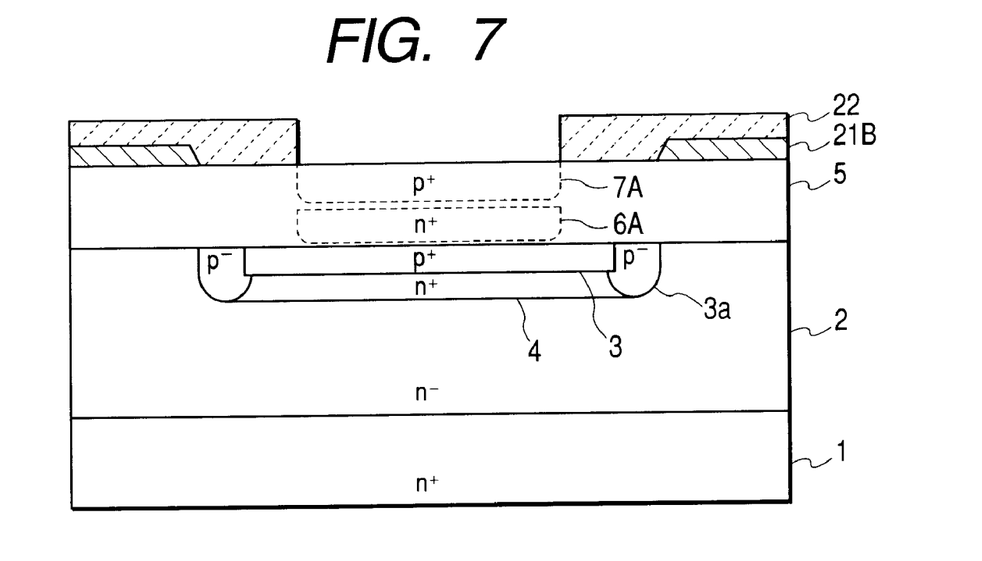

With reference to FIG. 7, after the ion implantations, the polycrystalline silicon film 21 is subjected to thermal oxidation (oxidization). Since the polycrystalline silicon film 21 is covered with the LTO film 22, only a given inner portion of the polycrystalline silicon film 21 which extends outward of the opening 21A is oxidated (oxidized). The oxidated portion of the polycrystalline silicon film 21 extends from a position coincident with the position of a side of the opening 21A to a position a given distance away outward from the outer edge of the predetermined place 6A or 7A. Only a portion 21B of the polycrystalline silicon film 21 remains on the channel layer 5 without being oxidated.

Figure 8:
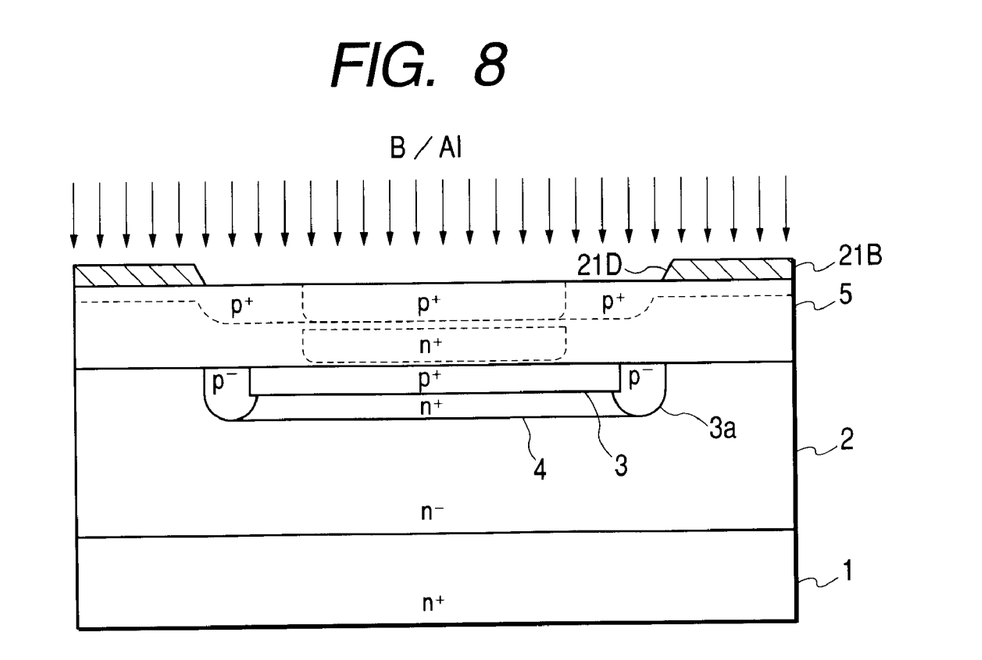

With reference to FIG. 8, the LTO film 22 and the oxidated portion of the polycrystalline silicon film 21 are removed from the semiconductor body (the semiconductor wafer) including the channel layer 5. As a result, there is only the remaining polycrystalline silicon film 21B on the channel layer 5. The remaining polycrystalline silicon film 21B has an opening 21D extending through the wall thereof. During the removal of the oxidated portion of the polycrystalline silicon film 21, the opening 21A expands into the opening 21D on an isotropic basis while the center of the expanding opening remains fixed. An area of the upper surface of the channel layer 5 which is uncovered from the remaining polycrystalline silicon film 21B extends over the first gate region 3 and the n$^+$-type body break region 4 as viewed from the top. While the remaining polycrystalline silicon film 21B is used as a mask, boron ions or aluminum ions being impurities corresponding to the p-type conductivity are implanted into the channel layer 5. A deep surface portion of the channel layer 5 which is exposed in the opening 21D undergoes ion implantation. On the other hand, a shallow surface portion of the channel layer 5 which is covered with the remaining polycrystalline silicon film 21B undergoes ion implantation. The deep surface portion of the channel layer 5 has a thickness greater than that of the shallow portion thereof. The deep surface portion and the shallow surface portion of the channel layer 5 occupy a predetermined place assigned to a second gate region 7. The deep surface portion and the shallow surface portion of the channel layer 5 correspond to the deep portion and the shallow portion (the inner portion and the outer portion) of the second gate region 7, respectively. Then, the remaining polycrystalline silicon film 21B is removed from the semiconductor body including the channel layer 5.

Figure 9:
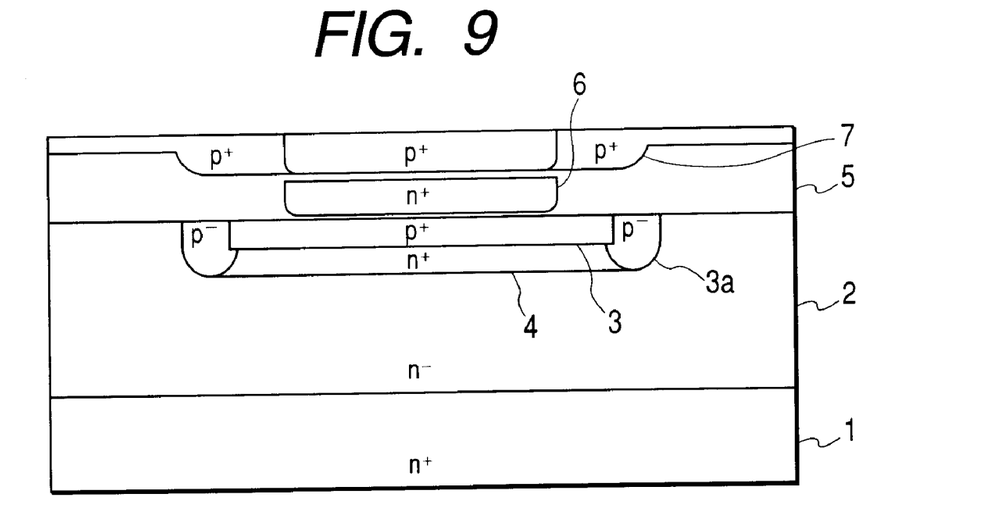

With reference to FIG. 9, after the removal of the remaining polycrystalline silicon film 21B, implanted ions are activated by heat treatment. As a result, the n$^+$-type source region 6 and the second gate region 7 are formed. Since the formation of the n$^+$-type source region 6 is implemented by the steps including the ion implantation via the opening 21A (see FIG. 6), the position of the n$^+$-type source region 6 is determined by the position of the opening 21A. The oxidated portion of the polycrystalline silicon film 21 extends around the opening 21A, and the oxidated portion and the opening 21A have a common center (see FIGS. 6 and 7). As previously mentioned, the oxidated portion of the polycrystalline silicon film 21 is removed so that the remaining polycrystalline silicon film 21B occurs (see FIG. 8). The opening 21D through the remaining polycrystalline silicon film 21B which occurs after the removal of the oxidated portion of the polycrystalline silicon film 21 has a center coincident with that of the opening 21A. The deep portion (inner portion) of the second gate region 7 is formed by the steps including the ion implantation via the opening 21D through the remaining polycrystalline silicon film 21B. Accordingly, the position of the deep portion of the second gate region 7 depends on the position of the opening 21A. Thus, the formation of the n$^+$-type source region 6 and the deep portion of the second gate region 7 is based on self-alignment. Therefore, the left-hand horizontal distance S1 between the outer edge of the n$^+$-type source region 6 and the outer edge of the deep portion of the second gate region 7 is equal to the right-hand horizontal distance S2 between the outer edge of the n$^+$-type source region 6 and the outer edge of the deep portion of the second gate region 7 (see FIG. 2).

Figure 10:
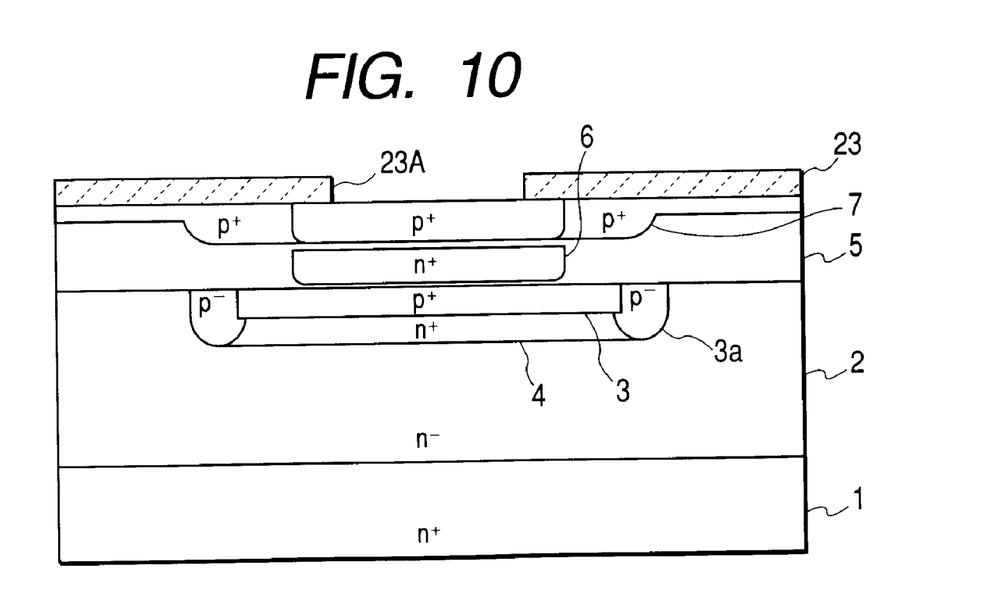

With reference to FIG. 10, an LTO film 23 is placed on an upper surface of the second gate region 7. The LTO film 23 is patterned by photolithography so that a prescribed portion of the LTO film 23 which is opposed to the greatly-doped portion (inner portion) of the second gate region 7 has an opening 23A extending through the wall thereof.

Figure 11:
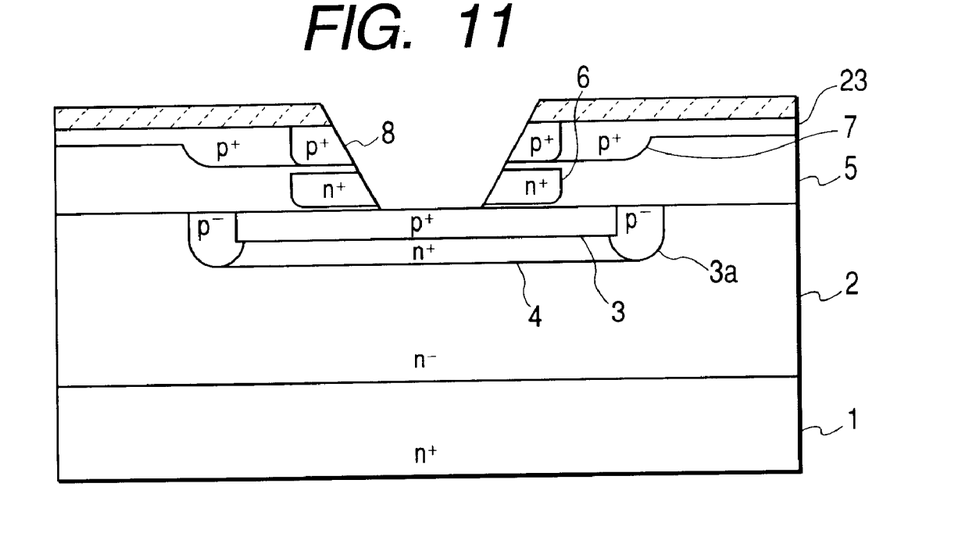

With reference to FIG. 11, after the formation of the opening 23A through the LTO film 23, the semiconductor body is subjected to etching (for example, RIE or reactive ion etching) so that a recess 8 is formed therein. The recess 8 extends through the second gate region 7 and the n$^+$-type source region 6, and reaches the first gate region 3.

Figure 12:
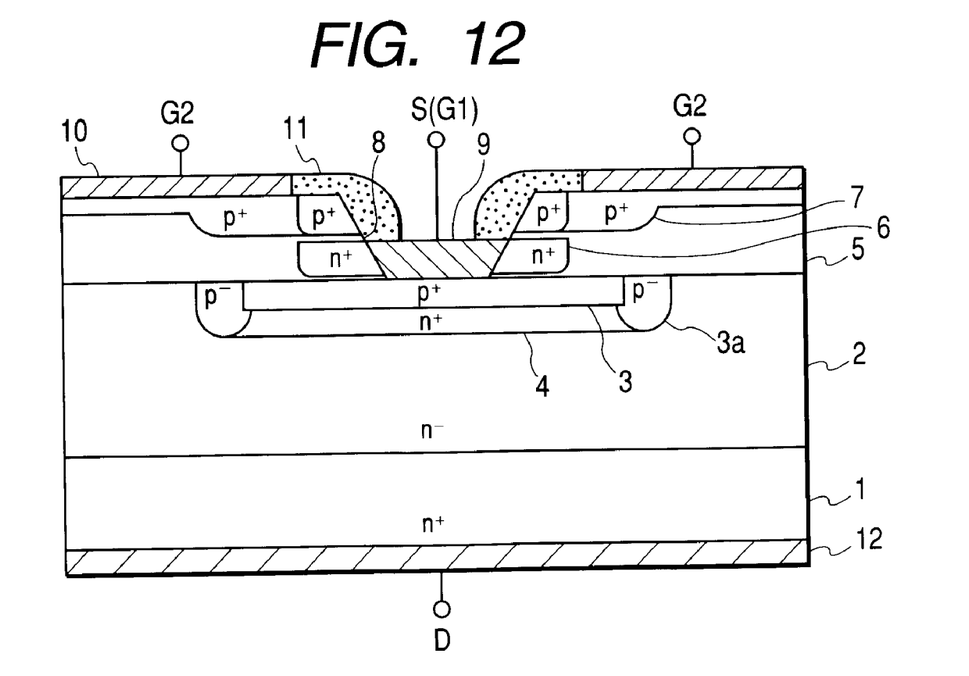

With reference to FIG. 12, after the formation of the recess 8, upper surfaces of the semiconductor body are coated with a passivation film 11. The passivation film 11 extends into the recess 8. The passivation film 11 is patterned to form contact holes. An electrode layer is formed on upper surfaces of the patterned passivation film 11 and exposed upper surfaces of the semiconductor body. The electrode layer is patterned to form a source electrode 9 and a second gate electrode 10. The source electrode 9 is electrically connected with not only the n$^+$-type source region 6 but also the first gate region 3. The second gate electrode 10 is electrically connected with the second gate region 7. Thereafter, a drain electrode 12 is formed on the back surface of the n$^+$-type substrate 1. As a result, the JFET of FIG. 2 is completed. The drain electrode 12 is electrically connected with the n$^+$-type substrate 1.

As understood from the previous description, the fabrication of the JFET of FIG. 2 includes the following steps. A laminate of a polycrystalline silicon film 21 and an LTO film 22 is formed on a channel layer 5, and then aligned openings 21A and 22A are provided through the polycrystalline silicon film 21 and the LTO film 22 respectively. While the laminate is used as a mask, ion implantations into the channel layer 5 are executed. Specifically, ions being impurities corresponding to the n-type conductivity are implanted via the openings 21A and 22A into a place in the channel layer 5 which is assigned to an n$^+$-type source region 6. Also, ions being impurities corresponding to the p-type conductivity are implanted via the openings 21A and 22A into another place in the channel layer 5 which is assigned to a portion of a second gate region 7. A portion of the polycrystalline silicon film 21 which extends from the related opening 21A is thermally oxidated. The LTO film 22 and the oxidated portion of the polycrystalline silicon film 21 are removed. While a remaining portion 21B of the polycrystalline silicon film 21 is used as a mask, ions being impurities corresponding to the p-type conductivity are implanted into a place in the channel layer 5 which is assigned to the whole of the second gate region 7. Accordingly, the n$^+$-type source region 6 and the second gate region 7 are formed on a self-alignment basis which suppresses a variation in channel length.

Second Embodiment

A second embodiment of this invention is similar to the first embodiment thereof except for points mentioned later. According to the second embodiment of this invention, the JFET of FIG. 2 is fabricated by steps including the following steps. A polycrystalline silicon film 21 is superposed on an upper surface of the channel layer 5 (see FIG. 6). The polycrystalline silicon film 21 is patterned by photolithography so that a prescribed portion of the polycrystalline silicon film 21 has an opening 21A extending through the wall thereof. The opening 21A is located in a place opposed to an inner area of the first gate region 3. The opening 21A aligns with the first gate region 3 as viewed from the top.

Ion implantations into the channel layer 5 are implemented while the polycrystalline silicon film 21 is used as a mask. Specifically, nitrogen ions or phosphorus ions being impurities corresponding to the n-type conductivity are implanted via the opening 21A into a predetermined place 6A (see FIG. 6) in the channel layer 5 which is assigned to an n$^+$-type source region 6. Subsequently, boron ions or aluminum ions being impurities corresponding to the p-type conductivity are implanted via the opening 21A into a predetermined place 7A (see FIG. 6) in the channel layer 5 which is assigned to a greatly-doped portion of a second gate region 7.

Figure 13:
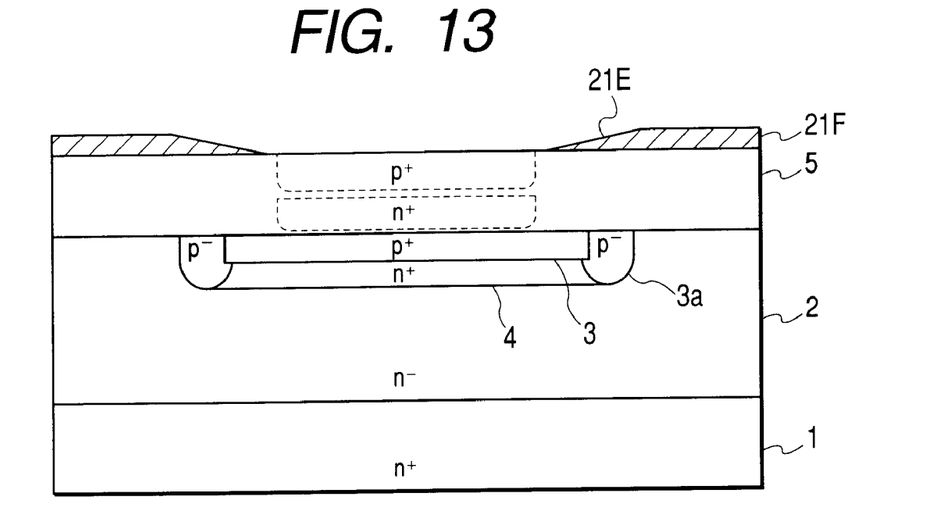
FIGS. 13 and 14 are sectional diagrams of different conditions of a 1-cell-corresponding portion of a semiconductor wafer which occur during the fabrication of an n-channel FET in a second embodiment of this invention.

With reference to FIG. 13, after the ion implantations, the polycrystalline silicon film 21 is subjected to isotropic etching such as wet etching. During the isotropic etching, the opening 21A expands into an opening 21E on an isotropic basis while the center thereof remains fixed. The degree of horizontal expansion of the opening in the left-hand part of FIG. 13 and the degree of horizontal expansion of the opening in the right-hand part of FIG. 13 are equal to each other. As a result of the isotropic etching, the opening 21E has tapered side surfaces, and the polycrystalline silicon film 21 shrinks to a polycrystalline silicon film 21F.

Figure 14:
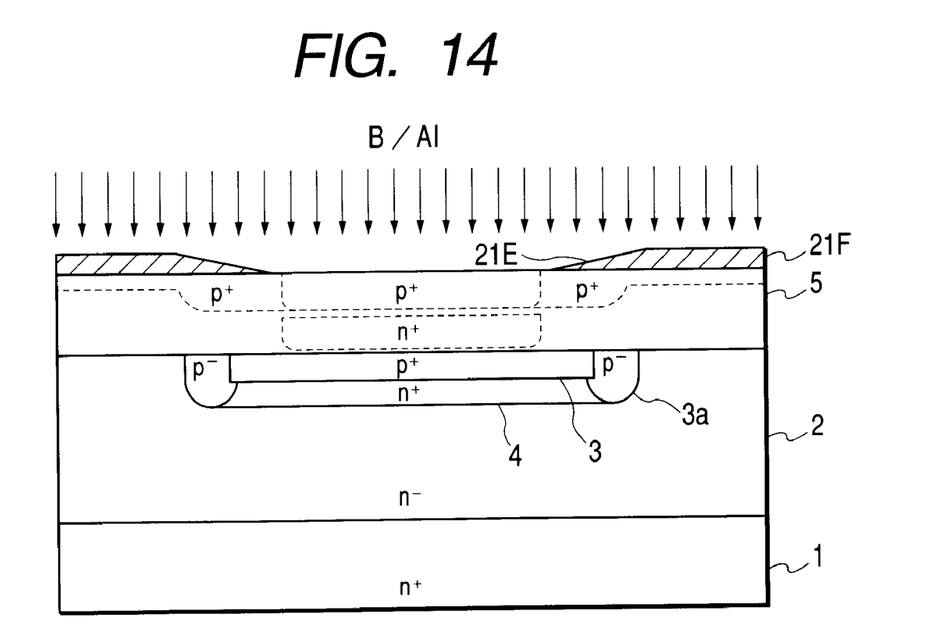

With reference to FIG. 14, while the polycrystalline silicon film 21F is used as a mask, boron ions or aluminum ions being impurities corresponding to the p-type conductivity are implanted into the channel layer 5. A deep surface portion of the channel layer 5 which is exposed in the opening 21E undergoes ion implantation. On the other hand, a shallow surface portion of the channel layer 5 which is covered with the polycrystalline silicon film 21F undergoes ion implantation. The deep surface portion of the channel layer 5 has a thickness greater than that of the shallow portion thereof. The deep surface portion and the shallow surface portion of the channel layer 5 occupy a predetermined place assigned to a second gate region 7. The deep surface portion and the shallow surface portion of the channel layer 5 correspond to the deep portion and the shallow portion (the inner portion and the outer portion) of the second gate region 7, respectively.

Since the formation of the $n^+$-type source region 6 is implemented by the steps including the ion implantation via the opening 21A in the polycrystalline silicon film 21 (see FIG. 6), the position of the $n^+$-type source region 6 is determined by the position of the opening 21A. During the isotropic etching, the opening 21A expands into the opening 21E on an isotropic basis while the center thereof remains fixed. The degree of horizontal expansion of the opening in the left-hand part of FIG. 13 and the degree of horizontal expansion of the opening in the right-hand part of FIG. 13 are equal to each other. The deep portion (inner portion) of the second gate region 7 is formed by the steps including the ion implantation via the opening 21E in the polycrystalline silicon film 21F. Accordingly, the position of the deep portion of the second gate region 7 depends on the position of the opening 21A. Thus, the formation of the $n^+$-type source region 6 and the deep portion of the second gate region 7 is based on self-alignment.

Third Embodiment

Figure 15:
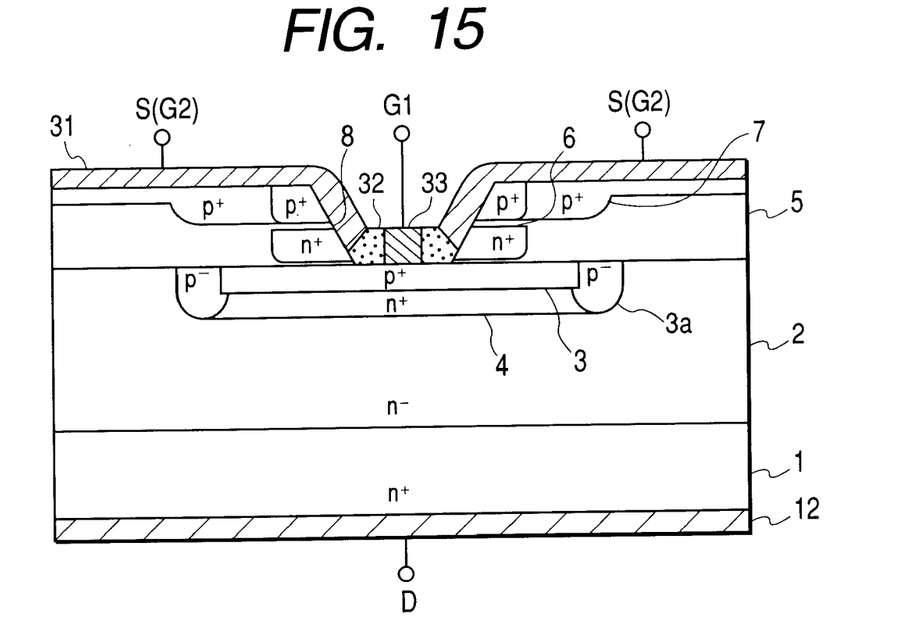
FIG. 15 is a sectional diagram of an n-channel JFET according to a third embodiment of this invention.

FIG. 15 shows a silicon carbide semiconductor device according to a third embodiment of this invention. The semiconductor device of FIG. 15 is an n-channel JFET (junction field-effect transistor) of a single gate drive type. A JFET corresponding to one cell is illustrated in FIG. 15. The JFET of FIG. 15 is similar to the JFET of FIG. 2 except for design changes mentioned hereafter. The JFET of FIG. 15 is designed so that the second gate region 7 and the $n^+$-type source region 6 will be subjected to a same potential (a same voltage).

The JFET of FIG. 15 includes a source electrode 31 electrically connected with not only the $n^+$-type source region 6 but also the second gate region 7. The source electrode 31 can act as a second gate electrode for controlling the voltage at the second gate region 7. The JFET of FIG. 15 includes a passivation film 32 and a first gate electrode 33. The first gate electrode 33 is electrically connected with the first gate region 3. The passivation film 32 insulates and separates the source electrode 31 and the first gate electrode 33 from each other.

The JFET of FIG. 15 is designed to operate as a normally-off device. The impurity concentrations of the first gate region 3, the second gate region 7, and the channel layer 5 are chosen to implement the following steps of JFET operation. In the absence of application of a voltage to the first gate electrode 33, a depletion layer extending from the first gate region 3 and a depletion layer extending from the second gate region 7 cause the channel layer 5 to be in a pinch-off state. When a desired voltage is applied to the first gate electrode 33, the length of the depletion layer from the first gate region 3 is decreased so that a channel occurs. Thus, in this case, a current flows in an order as "the source electrode 9→the $n^+$-type source region 6→the channel layer 5→the $n^-$-type epitaxial layer 2→the $n^+$-type substrate 1→the drain electrode 12".

The method of fabrication of the JFET in FIG. 15 is basically similar to that of the JFET in FIG. 2. The patterning of an electrode layer during the fabrication of the JFET in FIG. 15 is modified from that during the fabrication of the JFET in FIG. 2. The modification of the patterning provides the source electrode 31 and the first gate electrode 33.

Fourth Embodiment

Figure 16:
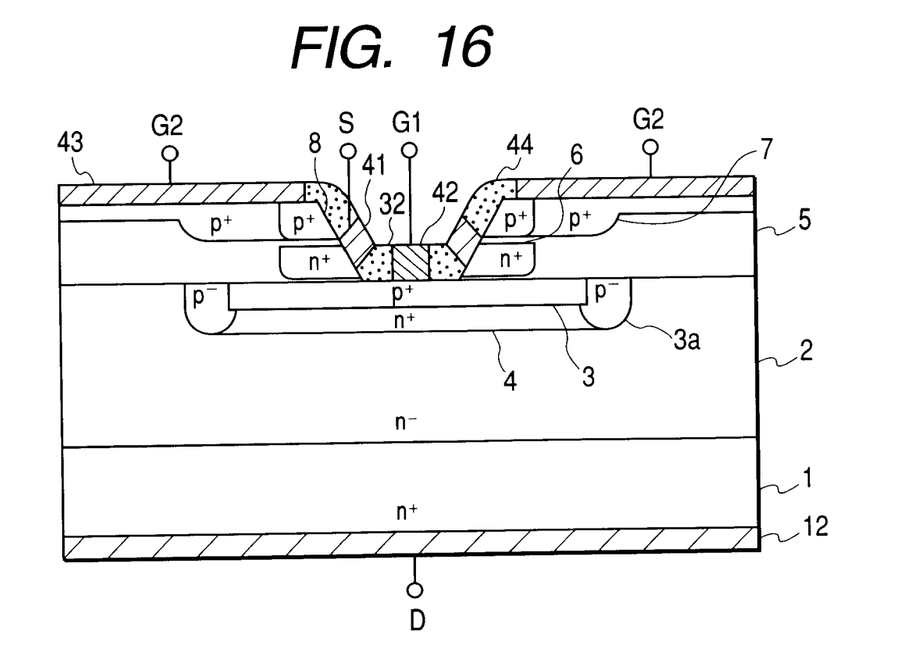
FIG. 16 is a sectional diagram of an n-channel JFET according to a fourth embodiment of this invention.

FIG. 16 shows a silicon carbide semiconductor device according to a fourth embodiment of this invention. The semiconductor device of FIG. 16 is an n-channel JFET (junction field-effect transistor) of a double gate drive type. A JFET corresponding to one cell is illustrated in FIG. 16. The JFET of FIG. 16 is similar to the JFET of FIG. 2 except for design changes mentioned hereafter.

The JFET of FIG. 16 includes a source electrode 41, a first gate electrode 42, a second gate electrode 43, and a passivation film or films 44. The source electrode 41 is electrically connected with the $n^+$-type source region 6. The first gate electrode 42 is electrically connected with the first gate region 3. The second gate electrode 43 is electrically connected with the second gate region 7. The passivation film or films 44 insulate and separate the source electrode 41, the first gate electrode 42, and the second gate electrode 43 from each other.

The JFET of FIG. 16 is designed to operate as a normally-off device. The impurity concentrations of the first gate region 3, the second gate region 7, and the channel layer 5 are chosen to implement the following steps of JFET operation. In the absence of application of voltages to the first and gate electrodes 42 and 43, a depletion layer extending from the first gate region 3 and a depletion layer extending from the second gate region 7 cause the channel layer 5 to be in a pinch-off state. When a desired voltage is applied to one of the first and second gate electrodes 42 and 43, the length of the depletion layer from the first gate region 3 or the second gate region 7 is decreased so that a channel occurs. When desired voltages are applied to the first and second gate electrodes 42 and 43 respectively, the lengths of the depletion layers from the first and second gate regions 3 and 7 are decreased so that a channel occurs. Thus, in these cases, a current flows in an order as "the source electrode 9→the $n^+$-type source region 6→the channel layer 5→the $n^-$-type epitaxial layer 2→the $n^+$-type substrate 1→the drain electrode 12". In the JFET of FIG. 16, both the lengths of the depletion layers from the first and second gate regions 3 and 7 can be controlled. Thus, the JFET of FIG. 16 has a relatively low on-resistance (on-state resistance).

The method of fabrication of the JFET in FIG. 16 is basically similar to that of the JFET in FIG. 2. The patterning of an electrode layer during the fabrication of the JFET in FIG. 16 is modified from that during the fabrication of the JFET in FIG. 2. The modification of the patterning provides the source electrode 41, the first gate electrode 42, and the second gate electrode 43.

Fifth Embodiment

A JFET in a fifth embodiment of this invention is similar to the JFET in one of the first, second, third, and fourth embodiments thereof except for the following point. The JFET in the fifth embodiment of this invention is of a p-channel type.

Sixth Embodiment

A JFET in a sixth embodiment of this invention is similar to the JFET in one of the first, second, third, and fourth embodiments thereof except for the following point. The JFET in the sixth embodiment of this invention is of a normally-on type.

Seventh Embodiment

A seventh embodiment of this invention is similar to one of the first, second, third, and fourth embodiments thereof except for the following point. According to the seventh embodiment of this invention, carbon ions are implanted while boron ions are implanted. In other words, boron ions and carbon ions are simultaneously implanted. In this case, a high activation yield is attained.

Eighth Embodiment

An eighth embodiment of this invention is similar to one of the first, second, third, and fourth embodiments thereof except for the following point. The eighth embodiment of this invention implements simultaneous implantation of nitrogen ions and phosphorus ions instead of implantation of only nitrogen ions or only phosphorus ions.

Ninth Embodiment

A ninth embodiment of this invention is similar to one of the first, second, third, and fourth embodiments thereof except for the following points. According to the ninth embodiment of this invention, the formation of each of the p-type doped layers (for example, the first gate region 3 and the second gate region 7) and the n-type doped layers (for example, the $n^+$-type source region 6) uses a mixer of ions being impurities corresponding to the p-type conductivity and ions being impurities corresponding to the n-type conductivity as a dopant. For each of the p-type doped layers, the number (amount) of impurities corresponding to the p-type conductivity in the mixture is greater than that of impurities corresponding to the n-type conductivity. For each of the n-type doped layers, the number (amount) of impurities corresponding to the n-type conductivity in the mixture is greater than that of impurities corresponding to the p-type conductivity. In this case, low activation energy suffices, and a high carrier density is attained.

What is claimed is:

1. A method of fabricating a silicon carbide semiconductor device, comprising the steps of:

forming a semiconductor layer (2) on a main surface of a semiconductor substrate (1), the semiconductor layer (2) and the semiconductor substrate (1) being of a first conductivity type, the semiconductor layer (2) being made of silicon carbide, the semiconductor substrate (1) being made of silicon carbide, the semiconductor layer (2) being higher in resistivity than the semiconductor substrate (1);

forming a first gate region (3) in a surface portion of the semiconductor layer (2), the first gate region (3) being of a second conductivity type different from the first conductivity type;

forming a channel layer (5) of the first conductivity type on the semiconductor layer (2) and the first gate region (3);

forming a source region (6) of the first conductivity type in the channel layer (5), the source region (6) being opposed to the first gate region (3);

forming a second gate region (7) in a surface portion of the channel layer (5), the second gate region (7) being of the second conductivity type and containing a positional range opposed to the source region (6);

forming a recess (8) in the channel layer (5), the recess (8) extending through the second gate region (7) and the source region (6) and reaching the first gate region (3);

forming a first gate electrode (9, 33, 42), a source electrode (9, 32, 41), and a second gate electrode (10, 32, 43), the first gate electrode (9, 33, 42) being electrically connected with the first gate region (3), the source electrode (9, 32, 41) being electrically connected with the source region (6), the second gate electrode (10, 32, 43) being electrically connected with the second gate region (7); and forming a drain electrode (12) on a back surface of the semiconductor substrate (1);

wherein the step of forming the source region (6) and the step of forming the second gate region (7) comprise the sub-steps of:

(a) placing first and second mask films (21, 22) on the channel layer (5), the first mask film (21) being covered with the second mask film (22);

(b) forming first and second openings (21A, 22A) in the first and second mask films (21, 22) respectively;

(c) implanting first ions into a first predetermined place in the channel layer (5) which is assigned to the source region (6) while using the first and second mask films (21, 22) as a mask, the first ions being first impurities corresponding to the first conductivity type;

(d) implanting second ions into a second predetermined place in the channel layer (5) which is different from the first predetermined place and is assigned to a portion of the second gate region (7) while using the first and second mask films (21, 22) as a mask, the second ions being second impurities corresponding to the second conductivity type;

(e) oxidating a portion of the first mask film (21) which extends from the first opening (21A) while the first mask film (21) remains covered with the second mask film (22);

(f) removing the second mask film (22) and the oxidated portion of the first mask film (21);

(g) implanting third ions into a third predetermined place in the channel layer (5) which is different from the first predetermined place and is assigned to the second gate region (7) while using a remaining portion (21B) of the first mask film (21) as a mask, the third ions being third impurities corresponding to the second conductivity type; and (h) activating the implanted first, second, and third impurities to form the source region (6) and the second gate region (7).

2. A method as recited in claim 1, wherein the first mask film (21) uses a polycrystalline silicon film.

3. A method as recited in claim 1, wherein the second mask film (22) uses one of an oxide film and a nitride film.

4. A method as recited in claim 1, further comprising the step of forming a body break region (4) located below the first gate region (3) and being of the first conductivity type.

5. A method as recited in claim 4, wherein the step of forming the first gate region (3) and the step of forming the body break region (4) comprise ion implantations using a same mask.

6. A method as recited in claim 1, wherein the step of forming the first gate region (3) comprises the sub-steps of implanting boron ions into the surface portion of the semiconductor layer (2), the boron ions being impurities corresponding to the second conductivity type, activating the impurities in the surface portion of the semiconductor layer (2) to form the first gate region (3), and diffusing the impurities out of the first gate region (3) to form a second-conductivity-type region (3a) deeper than the first gate region (3).

7. A method as recited in claim 1, wherein one among the step of forming the first gate region (3), the step of forming the source region (6), and the step of forming the second gate region (7) comprises the sub-step of using a mixture of fourth impurities corresponding to the first conductivity type and fifth impurities corresponding to the second conductivity type.

8. A method as recited in claim 7, wherein in cases where one among the step of forming the first gate region (3) and the step of forming the second gate region (7) comprises the sub-step of using a mixture of fourth impurities corresponding to the first conductivity type and fifth impurities corresponding to the second conductivity type, a density of the fifth impurities is higher than that of the fourth impurities; and in cases where the step of forming the source region (6) comprises the sub-step of using a mixture of fourth impurities corresponding to the first conductivity type and fifth impurities corresponding to the second conductivity type, a density of the fourth impurities is higher than that of the fifth impurities.

9. A method as recited in claim 1, wherein the step of forming the first gate region (3), the step of forming the channel layer (5), and the step of forming the second gate region (7) comprise the sub-steps of setting impurity concentrations of the first gate region (3), the channel layer (5), and the second gate region (7) so that a depletion layer extending from the first gate region (3) and a depletion layer extending from the second gate region (7) cause the channel layer (5) to be in a pinch-off state in the absence of application of a voltage to the first gate region (3) and the second gate region (7).

10. A method as recited in claim 9, wherein the step of forming the channel layer (5) comprises the sub-step of setting the impurity concentration of the channel layer lower than that of the semiconductor layer (2).

11. A method of fabricating a silicon carbide semiconductor device, comprising the steps of:

forming a semiconductor layer (2) on a main surface of a semiconductor substrate (1), the semiconductor layer (2) and the semiconductor substrate (1) being of a first conductivity type, the semiconductor layer (2) being made of silicon carbide, the semiconductor substrate (1) being made of silicon carbide, the semiconductor layer (2) being higher in resistivity than the semiconductor substrate (1);

forming a first gate region (3) in a surface portion of the semiconductor layer (2), the first gate region (3) being of a second conductivity type different from the first conductivity type;

forming a channel layer (5) of the first conductivity type on the semiconductor layer (2) and the first gate region (3);

forming a source region (6) of the first conductivity type in the channel layer (5), the source region (6) being opposed to the first gate region (3);

forming a second gate region (7) in a surface portion of the channel layer (5), the second gate region (7) being of the second conductivity type and containing a positional range opposed to the source region (6);

forming a recess (8) in the channel layer (5), the recess (8) extending through the second gate region (7) and the source region (6) and reaching the first gate region (3);

forming a first gate electrode (9, 33, 42), a source electrode (9, 32, 41), and a second gate electrode (10, 32, 43), the first gate electrode (9, 33, 42) being electrically connected with the first gate region (3), the source electrode (9, 32, 41) being electrically connected with the source region (6), the second gate electrode (10, 32, 43) being electrically connected with the second gate region (7); and forming a drain electrode (12) on a back surface of the semiconductor substrate (1);

wherein the step of forming the source region (6) and the step of forming the second gate region (7) comprise the sub-steps of:

(a) placing a mask film (21) on the channel layer (5);

(b) forming an openings (21A) in the first mask film (21);

(c) after the step (b), implanting first ions into a first predetermined place in the channel layer (5) which is assigned to the source region (6) while using the mask film (21) as a mask, the first ions being first impurities corresponding to the first conductivity type;

(d) after the step (b), implanting second ions into a second predetermined place in the channel layer (5) which is different from the first predetermined place and is assigned to a portion of the second gate region (7) while using the mask film (21) as a mask, the second ions being second impurities corresponding to the second conductivity type;

(e) subjecting the mask film (21) to isotropic etching to expand the opening;

(f) after the step (e), implanting third ions into a third predetermined place in the channel layer (5) which is different from the first predetermined place and is assigned to the second gate region (7) while using a remaining portion (21F) of the mask film (21) as a mask, the third ions being third impurities corresponding to the second conductivity type; and (g) activating the implanted first, second, and third impurities to form the source region (6) and the second gate region (7).

12. A method as recited in claim 11, wherein the mask film (21) uses a polycrystalline silicon film.

* * * * *